United States Patent
Ou et al.

(10) Patent No.: US 8,633,501 B2
(45) Date of Patent: Jan. 21, 2014

(54) LIGHT-EMITTING DEVICE HAVING A PATTERNED SURFACE

(75) Inventors: Chen Ou, Hsinchu (TW); Chiu-Lin Yao, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 453 days.

(21) Appl. No.: 12/646,553

(22) Filed: Dec. 23, 2009

(65) Prior Publication Data

US 2010/0096657 A1    Apr. 22, 2010

Related U.S. Application Data

(63) Continuation-in-part of application No. 12/222,548, filed on Aug. 12, 2008.

(30) Foreign Application Priority Data

Dec. 24, 2008 (TW) .............................. 97150633 A (51) Int. Cl.
*H01L 29/207* (2006.01)
(52) U.S. Cl.
USPC ...................... 257/98; 257/103; 257/E33.068

(58) Field of Classification Search
USPC ...................... 257/98, 103, E33.068
See application file for complete search history.

(56) References Cited

U.S. PATENT DOCUMENTS 7,642,561 B2 * 1/2010 Lee et al. ........................ 257/98
2006/0118802 A1   6/2006 Lee et al.

FOREIGN PATENT DOCUMENTS

CN          1812144 A        8/2006

* cited by examiner

*Primary Examiner* — Jack Chen
(74) *Attorney, Agent, or Firm* — Muncy, Geissler, Olds & Lowe, PLLC (57) ABSTRACT

The disclosure provides a light-emitting device comprising a substrate, an intermediate layer formed on the substrate, a first doped semiconductor layer with first conductivity-type formed on the intermediate layer, a second doped semiconductor layer with second conductivity-type formed on the first doped semiconductor layer, an active layer formed between the first doped semiconductor layer and the second doped semiconductor layer, and a patterned surface having a plurality of ordered pattern units; wherein the patterned surface is substantially not parallel to the corresponding region of the surface of the active layer.

26 Claims, 8 Drawing Sheets

FIG. 7 (PIROR ART)

LIGHT-EMITTING DEVICE HAVING A PATTERNED SURFACE

RELATED APPLICATION

This application is a continuation-in-part of U.S. patent application Ser. No. 12/222,548, entitled "Stamp Having Nanoscale Structure And Applications Thereof In Light-Emitting Device", filed on Aug. 12, 2008; and claims the right of priority based on TW application Ser. No. 097150633 filed on Dec. 24, 2008; the contents of which are incorporated herein by reference in their entirety.

BACKGROUND

1. Technical Field

The present disclosure relates to a light-emitting device having a patterned surface.

2. Description of the Related Art

Recently, efforts have been devoted to promote the luminance of the light-emitting diode (LED) in order to implement the device in the lighting domain, and further procure the goal of energy conservation and carbon reduction. There are two major aspects to promote luminance. One is to increase the internal quantum efficiency (IQE) by improving the epitaxy quality to enhance the combination efficiency of electrons and holes. The other is to increase the light extraction efficiency (LEE) that emphasizes on the light which is emitted by the light-emitting layer capable of escaping outside the device, and therefore reducing the light absorbed by the LED structure.

Figure 7:
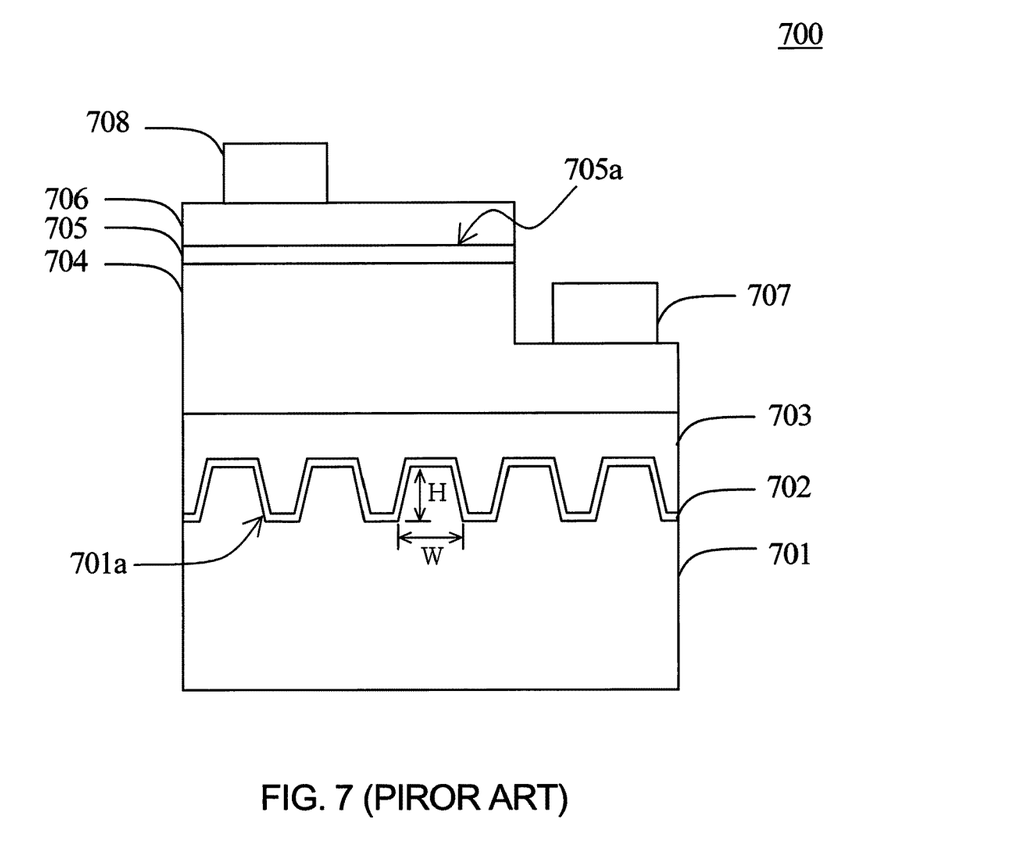
FIG. 7 shows a known structure of a light-emitting diode.

Surface roughening technology is one of the efficient methods to enhance luminance. FIG. 7 shows a known LED 700 having a patterned substrate. LED 700 comprises a growth substrate 701, an epitaxial stack, a first electrode 707, and a second electrode 708. The surface 701a of the growth substrate 701 has a plurality of trapezoid depression for improving the light-extraction efficiency. The epitaxial stack comprises a buffer layer 702 grown on the growth substrate, a non-doped semiconductor layer 703 grown on the buffer layer 702, a first semiconductor layer 704 with first conductivity-type grown on the non-doped semiconductor layer 703, an active layer 705 grown on the first semiconductor layer 704, a second semiconductor layer 706 with second conductivity-type grown on the active layer 705. The first electrode 707 is formed on the exposed first semiconductor layer 704, and the second electrode 708 is formed on the second semiconductor layer 706.

The ratio of the pattern width to the width between patterns of the substrate surface 701a is generally designed to be around 1. Therefore, a considerable portion of the substrate surface 701a is still parallel to the surface of the active layer 705a, and the light emitted from the active layer 705 to the parallel substrate surface is easily reflected back to the epitaxial stack because of total internal reflection (TIR) effect and absorbed by the epitaxial stack to generate heat. It worsens both the light extraction efficiency and the heat dissipation problems. Nevertheless, the pattern is usually formed deeper in order to compensate the light loss due to the parallel (unpatterned) region, but the high aspect ratio of the deeper pattern causes difficulty for subsequently epitaxial growth and adversely affects the epitaxial quality.

Another prior technique for roughen surface is to utilize mechanically polishing method to form a randomly distributed rough patterns on the substrate surface. By this method, it is hard to control the roughened dimension, such as the depth or the width. Moreover, the epitaxial quality is not good by growing an epitaxial layer on the randomly rough surface.

SUMMARY OF THE DISCLOSURE

The disclosure provides a light-emitting device having a patterned surface to achieve both epitaxial quality and light-extraction efficiency.

One aspect of the present disclosure provides a light-emitting device comprising a substrate, an intermediate layer formed on the substrate, a first doped semiconductor layer with first conductivity-type formed on the intermediate layer, a second doped semiconductor layer with second conductivity-type formed on the first doped semiconductor layer, an active layer formed between the first doped semiconductor layer and the second doped semiconductor layer, and a patterned surface having a plurality of ordered pattern units; wherein the patterned surface is substantially not parallel to the corresponding region of the surface of the active layer.

Another aspect of the present disclosure provides a light-emitting device comprising a substrate, an intermediate layer formed on the substrate, a first doped semiconductor layer with first conductivity-type formed on the intermediate layer, a second doped semiconductor layer with second conductivity-type formed on the first doped semiconductor layer, an active layer formed between the first doped semiconductor layer and the second doped semiconductor layer, and a patterned surface having a plurality of ordered pattern units; wherein each of the plurality of ordered pattern units is compactly disposed such that at least one of the plurality of ordered pattern units is substantially contacted with the neighboring units.

DETAILED DESCRIPTION OF THE EMBODIMENTS

Figure 1:
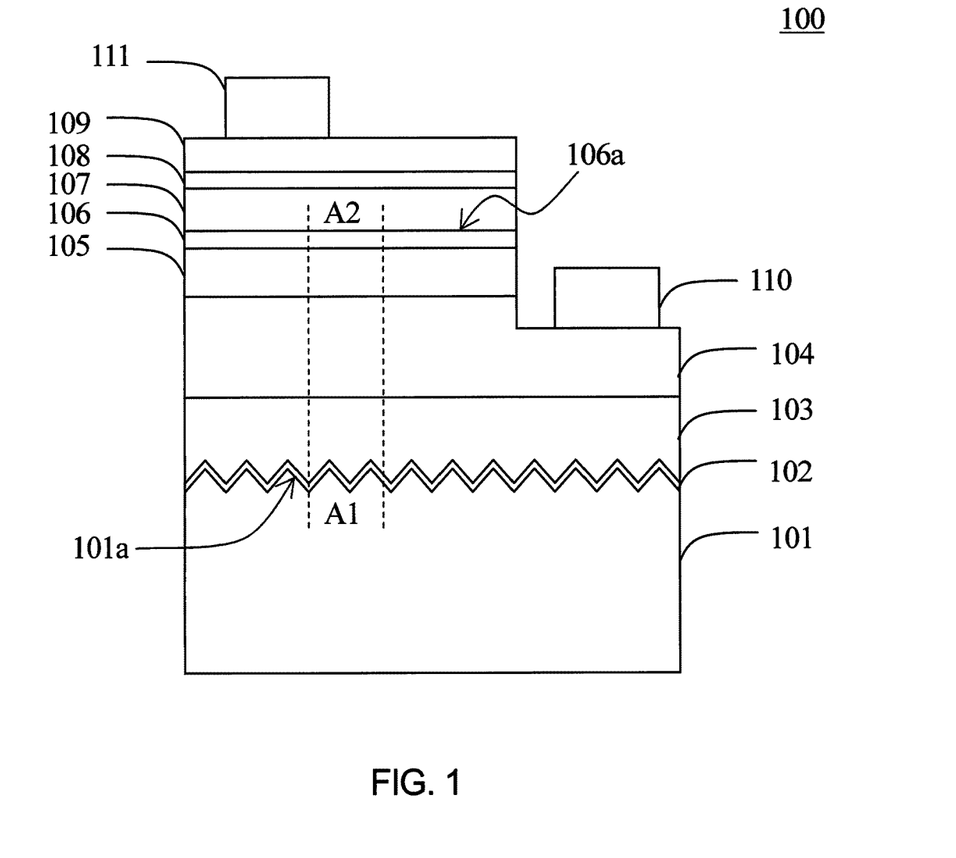
FIG. 1 shows a light-emitting device in accordance with the first embodiment of the present disclosure.

FIG. 1 shows a light-emitting device 100 in accordance with a first embodiment of the present disclosure. The light-emitting device 100 comprises a growth substrate 101, an intermediate layer comprising a buffer layer 102 and/or an undoped semiconductor layer 103 epitaxially grown on the growth substrate 101, a first contact layer 104 with first conductivity-type epitaxially grown on the intermediate layer, a first cladding layer 105 with first conductivity-type epitaxially grown on the first contact layer 104, an active layer 106 epitaxially grown on the first cladding layer 105, a second cladding layer 107 with second conductivity-type epitaxially grown on the active layer 106, a second contact layer 108 with second conductivity-type epitaxially grown on the second cladding layer 107, a current spreading layer 109 formed on the second contact layer 108 and forming an ohmic contact with the second contact layer 108, a first electrode 110 formed on the exposed first contact layer 104 by evaporation or sputtering method, and a second electrode 111 formed on the current spreading layer 109 by evaporation or sputtering method; wherein the growth substrate 101 has a patterned surface 101a comprising a plurality of ordered pattern units, and each of the plurality of ordered pattern units is compactly disposed, for example, at least one of the plurality of pattern units is substantially contacted with the neighboring units. According to the embodiment, any region of the patterned surface 101a, e.g. A1 region, is substantially not parallel to the corresponding region of the surface of the active layer, e.g. A2 region. The plurality of the ordered pattern units is disposed in a fixed period, variable period, or quasi-period. The top views of the plurality of pattern units comprise a polygon, or at least one pattern selected from the group consisting of triangle, rectangle, hexagon, and circle. The cross-sections of the plurality of pattern units comprise at least one pattern selected from the group consisting of V-shape, semicircle, arc, and polygon. Each of the plurality of pattern units has a width and a depth, and the depth is preferable less than the width for facilitating the subsequently grown buffer layer 102 and/or the undoped semiconductor layer 103 to fill into the depressed region of the patterned surface 101a.

Figure 2:
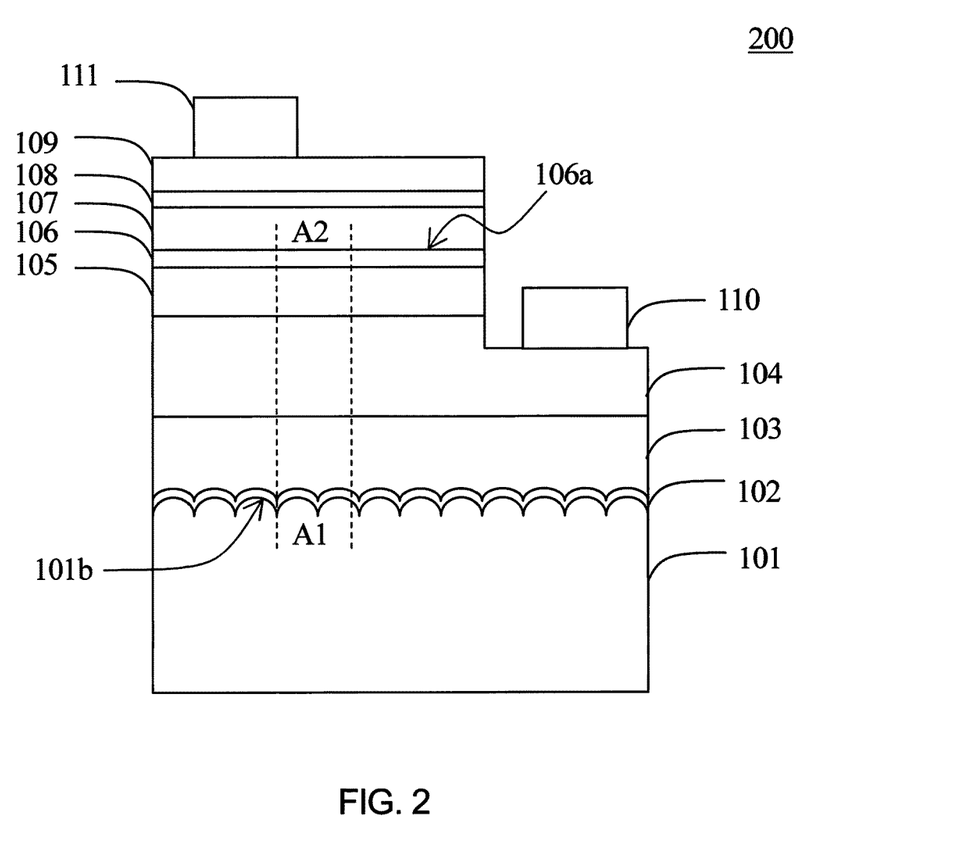
FIG. 2 shows a light-emitting device in accordance with the second embodiment of the present disclosure.

FIG. 2 shows a light-emitting device 200 in accordance with a second embodiment of the present disclosure. In comparison with the light-emitting device 100 shown in FIG. 1, the cross-section of the patterned surface 101b comprises a plurality of ordered patterned units, and each of the patterned units comprises a smooth curve for facilitating the subsequently grown buffer layer 102 and/or the undoped semiconductor layer 103 to fill into the depressed area of the patterned surface 101b. The method for forming the cross-section with a smooth curve comprises firstly forming a mask layer of photoresist on a plane substrate, patterning the mask layer by lithographic process, then curing the patterned mask layer in a baking machine under an appropriate temperature to reflow the patterned mask layer of photoresist to form a profile with smooth curve, finally dry-etching or wet-etching the substrate with the patterned mask layer to transfer the smooth curve profile to the substrate to form a patterned surface 101b with a smooth curve as shown in FIG. 2. The top views of the plurality of pattern units comprise polygon, or at least one pattern selected from the group consisting of triangle, rectangle, hexagon, and circle.

Figure 3:
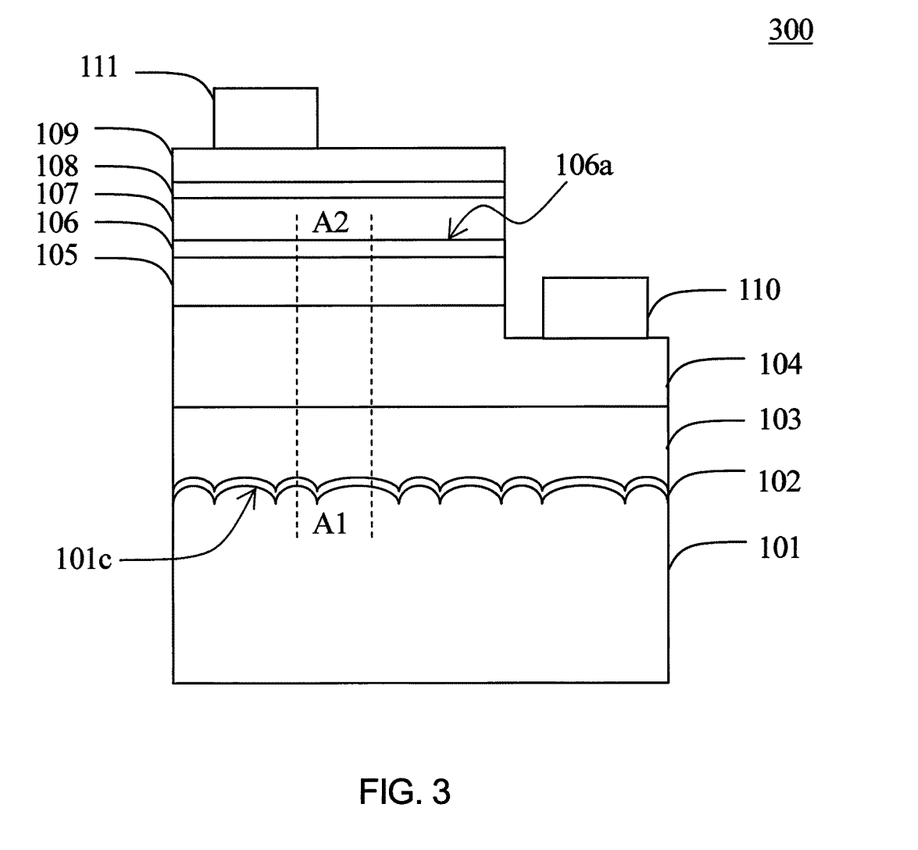
FIG. 3 shows a light-emitting device in accordance with the third embodiment of the present disclosure.

FIG. 3 shows a light-emitting device 300 in accordance with a third embodiment of the present disclosure. In comparison with the light-emitting device 200 shown in FIG. 2, the patterned surface 101c of the light-emitting device 300 comprises a plurality of patterned units with variable dimensions or variable patterns disposed in a fixed period, variable period, or quasi-period. The top views of the plurality of the pattern units comprise polygon, or at least one pattern selected from the group consisting of triangle, rectangle, hexagon, and circle. The cross-section of the plurality of pattern units comprises at least two curves with different curvatures.

Figure 4:
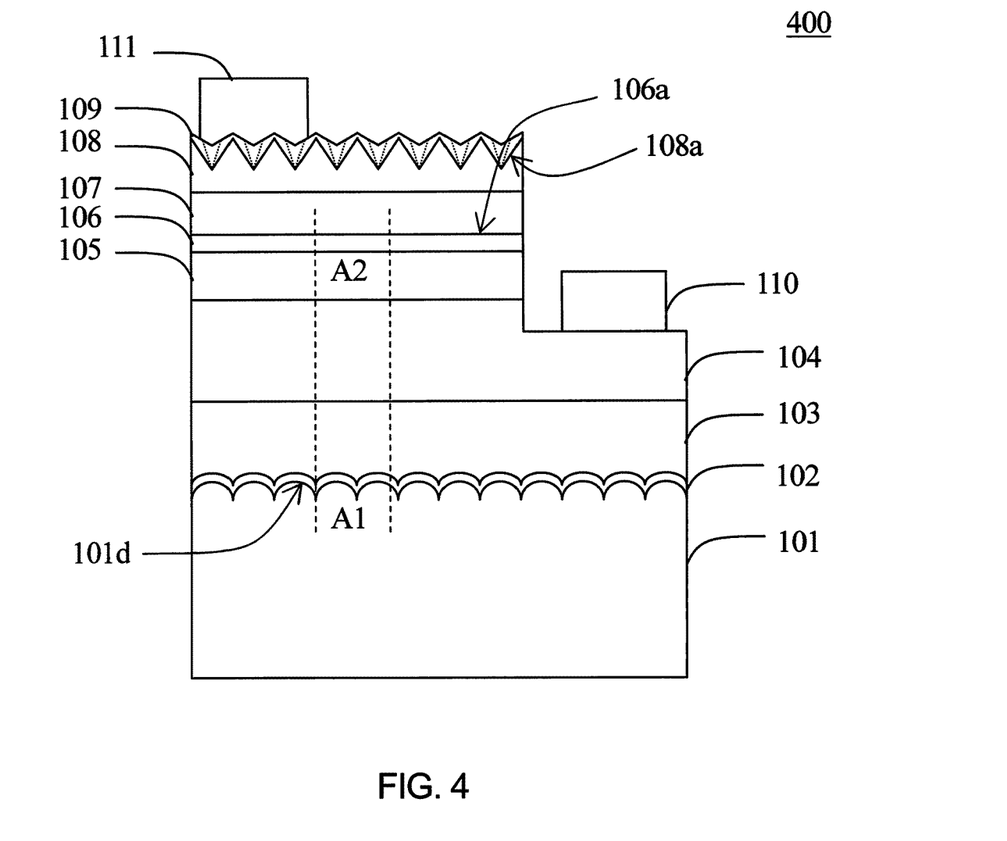
FIG. 4 shows a light-emitting device in accordance with the fourth embodiment of the present disclosure.

FIG. 4 shows a light-emitting device 400 in accordance with a fourth embodiment of the present disclosure. In comparison with the light-emitting device 200 shown in FIG. 2, the second contact layer 108 of the light-emitting device 400 further comprises an exterior surface 108a having the patterned surface as disclosed in the foregoing embodiments for further enhancing the light extraction efficiency, and any region of the patterned surface 108a is substantially not parallel to the corresponding region of the upper surface 106a of the active layer. The method for forming the exterior surface 108a of the second contact layer 108 comprises naturally growing the second contact layer 108 with hexagonal depressions by adjusting the epitaxial growth parameters, such as lowering the growth temperature, or changing the gas concentration ratio of Hydrogen to Nitrogen, or performing a traditional lithographic and etching process to form the patterned surface 108a with protrusions and/or depressions. The subsequently formed current spreading layer 109 is conformable with the patterned surface 108a and forms a good ohmic contact with the second contact layer 108.

Figure 5:
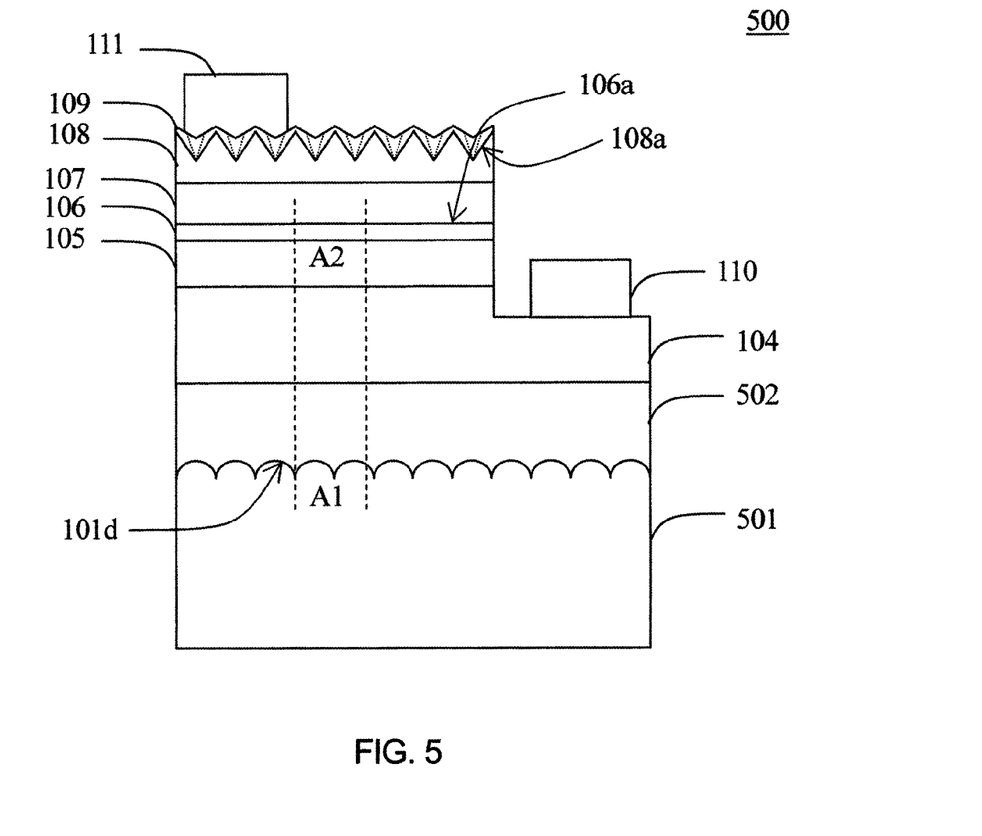
FIG. 5 shows a light-emitting device in accordance with the fifth embodiment of the present disclosure.

FIG. 5 shows a light-emitting device 500 in accordance with a fifth embodiment of the present disclosure. In comparison with the light-emitting device 200 shown in FIG. 2, the intermediate layer 502 of the light-emitting device 500 comprises a bonding layer, e.g. a transparent adhesive layer or a transparent conductive layer. The first contact layer 104 is joined to the second substrate 501 by a bonding technique, e.g. a direct bonding method or a thermo-compression bonding method. According to the present disclosure, the second substrate 501 is not limited to a material for epitaxial growth, and is flexible as long as the material meets the purpose, e.g. a material with high conductivity, a material with high transparency, a conductive material, or a material with high reflectivity.

Figure 6A:
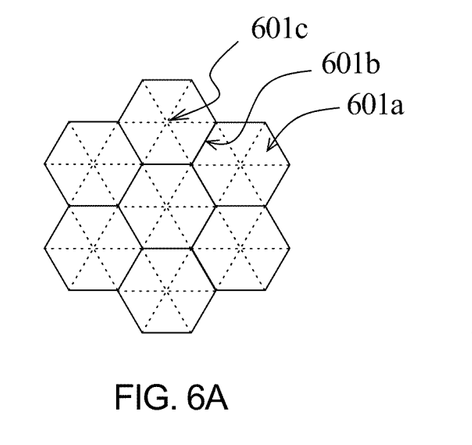
FIG. 6A to 6E show embodiments of the top views of the patterned surface in accordance with the present disclosure.
Figure 6B:
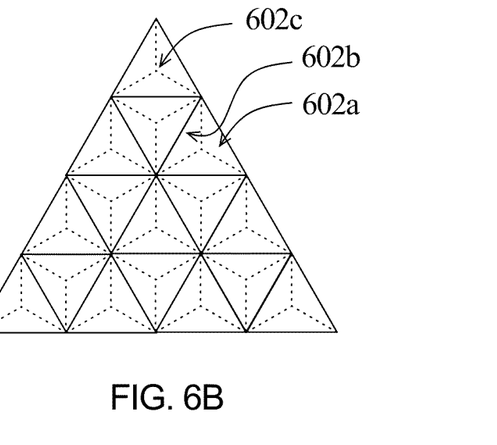
Figure 6C:
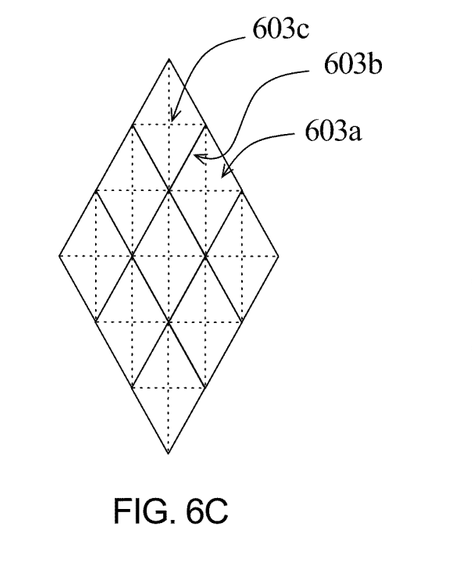
Figure 6D:
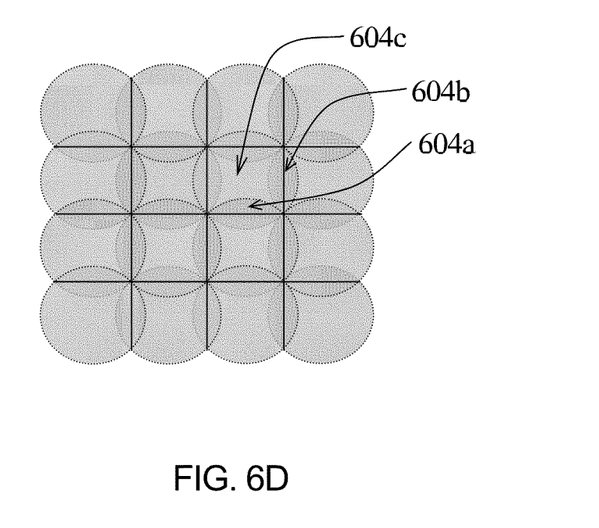
Figure 6E:
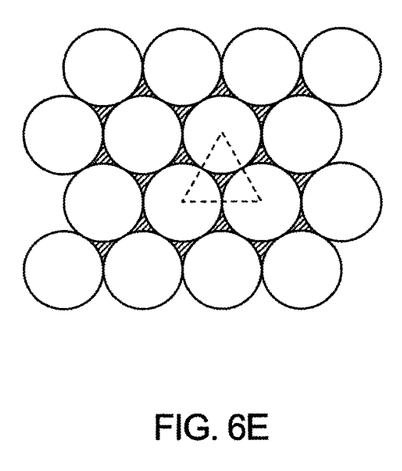

FIG. 6A to FIG. 6D shows the top views of the patterned surface in accordance with the present disclosure. As shown in FIG. 6A, the patterned surface comprises a plurality of hexagonal pattern units. Each of the pattern units is composed of six inclined surfaces 601a depressed or protruded from the substrate. The six inclined surfaces 601a are commonly joined at a vertex 601c, and mutually joined at six connecting sides 601b such that the patterned surface of the substrate is substantially not parallel to the corresponding region of the upper surface 106a of the active layer. As shown in FIG. 6B, the patterned surface comprises a plurality of triangular pattern units. Each of the pattern units is composed of three inclined surfaces 602a depressed or protruded from the substrate. The three inclined surfaces 602a are commonly joined at a vertex 602c, and mutually joined at three connecting sides 602b such that the patterned surface of the substrate is substantially not parallel to the corresponding region of the upper surface 106a of the active layer. As shown in FIG. 6C, the patterned surface comprises a plurality of rhombus pattern units. Each of the pattern units is composed of four inclined surfaces 603a depressed or protruded from the substrate. The four inclined surfaces 603a are commonly joined at a vertex 603c, and mutually joined at four connecting sides 603b such that the patterned surface of the substrate is substantially not parallel to the corresponding region of the upper surface 106a of the active layer. As shown in FIG. 6D, the patterned surface comprises a plurality of square pattern units defined by overlapped circles. Each of the pattern units is composed of four inclined surfaces 604a protruded from the substrate and a rounded top surface 604c. The plurality of pattern units are mutually joined at the connecting sides 604b such that the patterned surface of the substrate is substantially not parallel to the corresponding region of the upper surface 106a of the active layer. The statement of "the patterned surface of the substrate is substantially not parallel to the corresponding region of the upper surface of the active layer" as described in the foregoing embodiments does not exclude the circumstances caused by the various process deviations, such as the photoresist pattern distortion by lithographic deviation or pattern distortion by etching deviation such that portion of the to-be-patterned surface is not patterned or portion of the patterned region still comprises surface parallel to the active layer. For example, the vertices 601c, 602c, 603c, or rounded top surface 604c still possibly comprises a small mesa under the various process deviations, but the process deviations are preferred to be controlled to have the total surface area that is parallel to the active layer and the total surface area of the unpatterned surface do not exceed 3% of the total substrate area. As shown in FIG. 6E, the patterned surface comprises a plurality of circular pattern units. Each of the pattern units is disposed side by side in a tightest disposition such that the patterned surface area of the substrate that is parallel to the corresponding region of the upper surface 106a of the active layer is about 9.3% or not over 10% of the total substrate area, i.e. the ratio of the area of the triangular area subtracting the area of the three sectors to the area of the triangular area is about 9.3% or not over 10%.

The pattern units as disclosed in the foregoing embodiments have a relative higher patterned proportion, therefore increase the difficulty to epitaxially grow the subsequently buffer layer and the undoped semiconductor layer. In order to fulfill both light extraction efficiency and internal quantum efficiency, the cross-section of each of the pattern units has a width and a depth smaller than the width, i.e. the ratio of the depth to the width is lower than 1, therefore a pattern unit with a lower aspect ratio is achieved. The subsequently epitaxially grown buffer layer and/or the unpdoded semiconductor layer are easily filled into the depressed region of the patterned surface to enhance the epitaxial growth quality.

The patterned surface described in the above-mentioned embodiments is not limited to be formed on any surface of any specific structure of the light-emitting device in accordance with the present disclosure. It is still under the scope of the disclosure to form the patterned surface on any structure of the light-emitting device in accordance with the present disclosure. For example, the patterned surface can be formed on the light output surface of the light-emitting device contacting with the surroundings. The neighboring materials neighbored to the patterned structure includes but not limited to any structure of the light-emitting device, the encapsulating material, or the environmental medium having a different refraction index from the patterned structure. The difference of the refraction indexes of the patterned structure and the neighboring material is at least 0.1.

The materials of the buffer layer, the undoped semiconductor layer, the first contact layer, the first cladding layer, the second cladding layer, the second contact layer, and the active layer comprise III-V compound materials, e.g. $Al_pGa_qIn_{(1-p-q)}P$ or $Al_xIn_yGa_{(1-x-y)}N$, wherein, $0 \le p$, q, x, $y \le 1$; $(p+q) \le 1$; $(x+y) \le 1$. The first conductivity-type comprises n-type or p-type. The second conductivity-type comprises n-type or p-type and is different to the first conductivity-type. The current spreading layer comprises metal oxide, e.g. ITO, or well-conductive semiconductor layer of phosphide or nitride having high impurity concentration. The growth substrate comprises at least one material selected from the group consisting of GaP, sapphire, SiC, GaN, and AlN. The second substrate comprises a transparent material selected from the group consisting of GaP, sapphire, Sic, GaN, and AlN, or a heat dissipating material selected from the group consisting of diamond, diamond-like-carbon (DLC), ZnO, Au, Ag, Al, and other metals.

It will be apparent to those having ordinary skill in the art that various modifications and variations can be made to the methods in accordance with the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A light-emitting device comprising:
   a substrate;
   an intermediate layer on the substrate;
   a first doped semiconductor layer on the intermediate layer, having a first conductivity-type;
   a second doped semiconductor layer on the first doped semiconductor layer, having a second conductivity-type;
   an active layer between the first doped semiconductor layer and the second doped semiconductor layer, having a first surface; and
   a patterned surface different from the first surface, having a plurality of ordered pattern units;
   wherein the patterned surface is substantially non-parallel and non-perpendicular to the corresponding region of the first surface of the active layer; and
   wherein each of the pattern units has at least two inclined surfaces which abut, the abutting inclined surfaces are each not parallel to the corresponding region of the first surface of the active layer.

2. The light-emitting device according to claim 1, wherein the plurality of ordered pattern units are disposed in a fixed period, variable period, or quasi-period.

3. The light-emitting device according to claim 1, wherein the top view of the plurality of ordered pattern units comprises a polygon.

4. The light-emitting device according to claim 3, wherein the top view of the plurality of ordered pattern units comprises at least one pattern selected from the group consisting of triangle, rectangle, and hexagon.

5. The light-emitting device according to claim 1, wherein the cross-section of the plurality of ordered pattern units comprises at least one pattern having a V-shape.

6. The light-emitting device according to claim 1, wherein the cross-section of at least one of the plurality of ordered pattern units has a width and a depth smaller than the width.

7. The light-emitting device according to claim 1, wherein the patterned surface is a surface of the substrate.

8. The light-emitting device according to claim 1, wherein the patterned surface is an exterior surface of the light-emitting device.

9. The light-emitting device according to claim 1, wherein lines of the patterned surface are substantially not parallel to the corresponding region of the first surface of the active layer.

10. The light-emitting device according to claim 1, wherein the at least two inclined surfaces are commonly joined at a vertex.

11. The light-emitting device according to claim 1, wherein all of the patterned surface is inclined with respect to the first surface of the active layer.

12. The light-emitting device according to claim 1, the patterned surface extends from one side to an opposed side of the substrate.

13. A light-emitting device comprising:
   a substrate;
   an intermediate layer on the substrate;
   a first doped semiconductor layer on the intermediate layer, having a first conductivity-type;
   a second doped semiconductor layer on the first doped semiconductor layer, having a second conductivity-type;
   an active layer between the first doped semiconductor layer and the second doped semiconductor layer, having an first surface; and a patterned surface different from the first surface, having a plurality of ordered pattern units;

wherein the plurality of ordered pattern units are compactly disposed such that at least one of the plurality of ordered pattern units is substantially contacted with the neighboring units;

wherein a surface of each of the pattern units is substantially non-parallel and non-perpendicular to the corresponding region of the first surface of the active layer; and wherein each of the pattern units has at least two inclined surfaces which abut, the abutting inclined surfaces are each not parallel to the corresponding region of the first surface of the active layer.

14. The light-emitting device according to claim 13, wherein the patterned surface is substantially not parallel to the corresponding region of the first surface of the active layer.

15. The light-emitting device according to claim 13, wherein the plurality of ordered pattern units are disposed with a fixed period, variable period, or quasi-period.

16. The light-emitting device according to claim 13, wherein the top view of the plurality of ordered pattern units comprises a polygon.

17. The light-emitting device according to claim 16, wherein the top view of the plurality of ordered pattern units comprises at least one pattern selected from the group consisting of triangle, rectangle, and hexagon.

18. The light-emitting device according to claim 13, wherein the cross-section of the plurality of ordered pattern units comprises at least one pattern having a V shape.

19. The light-emitting device according to claim 13, wherein the cross-section of at least one of the plurality of ordered pattern units has a width and a depth smaller than the width.

20. The light-emitting device according to claim 13, wherein an area of the patterned surface that is parallel to the corresponding region of the first surface of the active layer is not over 10% of a total patterned surface area.

21. The light-emitting device according to claim 13, wherein the patterned surface is a surface of the substrate.

22. The light-emitting device according to claim 13, wherein the patterned surface is an exterior surface of the light-emitting device.

23. The light-emitting device according to claim 13, wherein lines of the patterned surface are substantially not parallel to the corresponding region of the first surface of the active layer.

24. The light-emitting device according to claim 13, wherein the at least two inclined surfaces are commonly joined at a vertex.

25. The light-emitting device according to claim 13, wherein all of the patterned surface is inclined with respect to the first surface of the active layer.

26. The light-emitting device according to claim 13, the patterned surface extends from one side to an opposed side of the substrate.

* * * * *